(12) United States Patent
So

(10) Patent No.: US 12,232,353 B2
(45) Date of Patent: Feb. 18, 2025

(54) DISPLAY APPARATUS INCLUDING A CATHODE LAYER DISCONNECTING STRUCTURE

(71) Applicant: LG Display Co., Ltd., Seoul (KR)

(72) Inventor: Byeong-Seong So, Seoul (KR)

(73) Assignee: LG Display Co., Ltd., Seoul (KR)

( * ) Notice: Subject to any disclaimer, the term of this patent is extended or adjusted under 35 U.S.C. 154(b) by 313 days.

(21) Appl. No.: 17/384,395

(22) Filed: Jul. 23, 2021

(65) Prior Publication Data

US 2022/0199944 A1 Jun. 23, 2022

(30) Foreign Application Priority Data

Dec. 18, 2020 (KR) .................. 10-2020-0178811

(51) Int. Cl.
*H10K 50/84* (2023.01)
*H10K 50/82* (2023.01)
(Continued)

(52) U.S. Cl.
CPC ......... *H10K 50/844* (2023.02); *H10K 50/822* (2023.02); *H10K 59/121* (2023.02);
(Continued)

(58) Field of Classification Search
CPC ............... H10K 50/844; H10K 50/822; H10K 50/8426; H10K 50/82; H10K 50/868; H10K 59/121; H10K 59/65; H10K 59/12; H10K 59/122; H10K 59/352; H10K 59/126; H10K 2102/351; H10K 27/14678; G02F 1/133331; G02F 1/133528
See application file for complete search history.

(56) References Cited

U.S. PATENT DOCUMENTS 9,859,345 B2 * 1/2018 Lee .................. H10K 71/00
11,487,370 B2 * 11/2022 Yang .................. G06F 3/0412
(Continued)

FOREIGN PATENT DOCUMENTS

EP 3016167 A1 * 5/2016 ............. H10K 50/00
KR 20100028415 A 3/2010
(Continued)

*Primary Examiner* — Ida M Soward
(74) *Attorney, Agent, or Firm* — Seed IP Law Group LLP

(57) ABSTRACT

The present disclosure relates to a display apparatus. The display apparatus includes a plurality of light-transmitting areas disposed between the plurality of pixels. The light-transmitting area is formed between structures disposed in the light-emitting area adjacent to the light-transmitting area, and the structure physically disconnects a cathode layer of the light-emitting area and a cathode layer of the light-transmitting area. The cathode layer may be patterned in the light-transmitting area. Accordingly, when patterning is performed with a laser, it is possible to prevent the edge of the cathode layer from being curled in the outer portion of the light-transmitting area. In addition, it is possible to pattern with low energy and solve the damage due to thermal energy of the laser beam by preventing heat conduction to the light-emitting area of the light-emitting device layer. Further, it is possible to improve the reliability by blocking the moisture permeable path.

22 Claims, 14 Drawing Sheets

(51) Int. Cl.
  *H10K 50/822* (2023.01)
  *H10K 50/844* (2023.01)
  *H10K 59/12* (2023.01)
  *H10K 59/121* (2023.01)
  *G02F 1/1333* (2006.01)
  *G02F 1/1335* (2006.01)
  *H01L 27/146* (2006.01)
  *H10K 50/80* (2023.01)
  *H10K 59/126* (2023.01)
  *H10K 59/35* (2023.01)

(52) U.S. Cl.
  CPC .. *G02F 1/133331* (2021.01); *G02F 1/133528* (2013.01); *H01L 27/14678* (2013.01); *H10K 50/868* (2023.02); *H10K 59/126* (2023.02); *H10K 59/352* (2023.02)

(56) References Cited

U.S. PATENT DOCUMENTS

| | | | | |
|---|---|---|---|---|
| 2007/0194307 A1* | 8/2007 | Kim | H10K 50/82 | 257/40 |
| 2009/0009069 A1* | 1/2009 | Takata | H10K 50/824 | 445/24 |
| 2009/0015153 A1* | 1/2009 | Asano | H10K 59/87 | 313/504 |
| 2010/0051929 A1* | 3/2010 | Choi | H10K 50/865 | 257/E51.026 |
| 2010/0127615 A1* | 5/2010 | Kim | H10K 50/84 | 445/24 |
| 2010/0231490 A1* | 9/2010 | Okano | H10K 59/122 | 345/80 |
| 2012/0049207 A1* | 3/2012 | Kim | H10K 59/122 | 118/301 |
| 2012/0228603 A1* | 9/2012 | Nakamura | H10K 50/828 | 257/40 |
| 2013/0248867 A1* | 9/2013 | Kim | H10K 50/844 | 438/34 |
| 2014/0183479 A1* | 7/2014 | Park | H10K 59/1315 | 438/34 |
| 2014/0183501 A1* | 7/2014 | Kim | H10K 59/1315 | 438/34 |
| 2016/0064461 A1* | 3/2016 | Lee | H10K 59/122 | 257/40 |
| 2016/0149156 A1* | 5/2016 | Kim | H10K 50/828 | 438/46 |
| 2017/0005292 A1* | 1/2017 | Lee | H10K 50/8445 | |
| 2017/0012240 A1* | 1/2017 | Nakajima | H10K 50/81 | |
| 2017/0047386 A1* | 2/2017 | Lee | H10K 59/1213 | |
| 2017/0194398 A1* | 7/2017 | Kim | H10K 59/352 | |
| 2017/0194415 A1* | 7/2017 | Choi | H10K 59/38 | |
| 2018/0151842 A1* | 5/2018 | Park | H10K 50/858 | |
| 2018/0182827 A1* | 6/2018 | Kim | H10K 59/353 | |
| 2018/0190731 A1* | 7/2018 | Park | G09G 3/3225 | |
| 2018/0294322 A1* | 10/2018 | Han | H01L 33/145 | |
| 2020/0006453 A1* | 1/2020 | Seko | H01L 29/66757 | |
| 2020/0075689 A1* | 3/2020 | Matsueda | H10K 59/353 | |
| 2020/0144540 A1* | 5/2020 | Lee | H10K 50/844 | |
| 2020/0168823 A1* | 5/2020 | Kim | H10K 59/8723 | |
| 2020/0212116 A1* | 7/2020 | Kim | H10K 50/822 | |
| 2020/0235172 A1* | 7/2020 | Lee | H10K 59/122 | |
| 2020/0313102 A1* | 10/2020 | Kim | H10K 59/124 | |
| 2020/0365667 A1* | 11/2020 | Jo | H10K 59/00 | |
| 2020/0381495 A1* | 12/2020 | Jeon | H10K 59/38 | |
| 2021/0028262 A1* | 1/2021 | Tanaka | H10K 59/126 | |
| 2021/0083019 A1* | 3/2021 | Jang | H10K 50/84 | |
| 2021/0192170 A1* | 6/2021 | Ma | G06F 3/0412 | |
| 2021/0217839 A1* | 7/2021 | Choi | H10K 59/123 | |
| 2021/0351250 A1* | 11/2021 | Guo | H10K 59/40 | |
| 2022/0013594 A1* | 1/2022 | Wang | H10K 59/121 | |
| 2022/0013598 A1* | 1/2022 | Park | H10K 59/352 | |
| 2022/0052134 A1* | 2/2022 | Zhang | H10K 59/131 | |

FOREIGN PATENT DOCUMENTS

| | | | | |
|---|---|---|---|---|
| KR | 20130107883 A | | 10/2013 | |
| KR | 20170041370 A | * | 4/2017 | ............ H10K 50/00 |
| KR | 20170080136 A | | 7/2017 | |
| KR | 20200131398 A | | 11/2020 | |

\* cited by examiner

DISPLAY APPARATUS INCLUDING A CATHODE LAYER DISCONNECTING STRUCTURE

CROSS REFERENCE TO RELATED APPLICATION

This application claims priority from Korean Patent Application No. 10-2020-0178811, filed on Dec. 18, 2020, which is hereby incorporated by reference for all purposes as if fully set forth herein.

BACKGROUND

Technical Field

The present disclosure relates to a display apparatus, more specifically, a display apparatus including areas with different resolutions.

Description of the Related Art

An electroluminescent display device is classified into an inorganic light emitting display device and an organic light emitting display device according to the material of the emission layer. An organic light emitting display device of an active matrix type includes an organic light emitting diode that emits light by itself, and has an advantage in that the response speed is fast and luminous efficiency, luminance, and viewing angle are large. In the organic light emitting display device, an organic light emitting diode is formed in each of the pixels. The organic light emitting display device has a fast response speed, excellent luminous efficiency, luminance, and viewing angle, and has excellent contrast ratio and color reproduction rate since it can express black gradations as completely black.

In modern society, the use of mobile terminals is essential, and multimedia functions for implementing various functions necessary in daily life through mobile terminals are being improved. For example, a camera is embedded into a smart phone by default, and the resolution of the camera is increasing to the level of a conventional digital camera. However, the front camera of a smart phone may affect the size and design of the screen, and may make it difficult to design a wider and more freely designed screen. Accordingly, in order to reduce the space occupied by the camera, a screen design including a notch or a punch hole has been adopted in the smart phone, but the screen size is still limited due to the camera, and it is still difficult to implement the full-screen display. The full-screen display refers to a display device implemented so that an image can be displayed on most of the front surface of a mobile terminal.

In order to implement a full-screen display, it is being proposed a method of providing an imaging area in which low-resolution pixels are arranged in the screen of a display panel, and placing a camera and/or various sensors at a position opposite the imaging area under the display panel.

BRIEF SUMMARY

The inventors have appreciated the technical problems of the related art. One of many problems identified by the inventors is that when irradiating a laser beam in the imaging area in which a camera and/or various sensors are disposed, the thermal energy reaching each position of the opening is different and thereby resulting in a defect. In order to solve the above mentioned problem, the inventors of the present disclosure provided embodiments related to a display apparatus in which patterning can be performed even with low thermal energy. The embodiments provided by the inventors are not limited to solving the above identified problem of the related art.

In accordance with an embodiment of the present disclosure may provide a display apparatus including a first area in which a plurality of first pixels are disposed, and a second area including a light-emitting area in which a plurality of second pixels are disposed and a plurality of light-transmitting areas disposed between the plurality of second pixels, wherein the light-transmitting area is formed between structures disposed in the light-emitting area, and the structure physically disconnects a cathode layer of the light-emitting area and a cathode layer of the light-transmitting area in the second area, and the cathode layer may be patterned in the light-transmitting area.

In addition, In accordance with another embodiment of the present disclosure may provide a display apparatus including a substrate including a light-emitting area and a light-transmitting area, a circuit layer formed on the substrate to include a thin film transistor, a planarization layer formed on the circuit layer to planarize a surface of the substrate, a light-emitting device layer formed on the planarization layer to include a bank layer, a cathode layer, and a structure, an encapsulation layer formed on the light-emitting device layer, and a cover glass formed on the encapsulation layer, wherein the light-transmitting area is formed between the structure disposed in the light-emitting area, and the structure may physically disconnect a cathode layer of the light-emitting area and a cathode layer of the light-transmitting area.

In addition, In accordance with another embodiment of the present disclosure may provide a display apparatus comprising: a substrate including a light-emitting area and a light-transmitting area; a circuit layer formed on the substrate to include a thin film transistor; a planarization layer formed on the circuit layer to planarize a surface of the substrate; and a light-emitting device layer formed on the planarization layer to include a bank layer, a cathode layer, and a structure, wherein one of the structure, the planarization layer and the bank layer has an inverse tapered shape, and the structure physically disconnects a cathode layer of the light-emitting area and a cathode layer of the light-transmitting area.

In addition to the technical problems of the present disclosure described above, other features and advantages of the present disclosure are described below, or may be clearly understood by those of ordinary skill in the art from the technology and description.

According to the embodiments of the present disclosure, by forming the cathode layer in a physical disconnected structure using an under-cut structure, it is possible to prevent the edge of the cathode layer from being curled in the outer portion of the light-transmitting area when performing the patterning with a laser.

In addition, since the cathode layer is physically disconnected, it is possible to pattern with low energy and solve the damage due to thermal energy of the laser beam by preventing heat conduction to the light-emitting area of the light-emitting device layer.

Further, by applying the under-cut structure, it is possible to improve the reliability by blocking the moisture permeable path.

The effects according to the present disclosure are not limited by the contents exemplified above, and more various effects may be included in the present disclosure.

DETAILED DESCRIPTION

Figure 1:
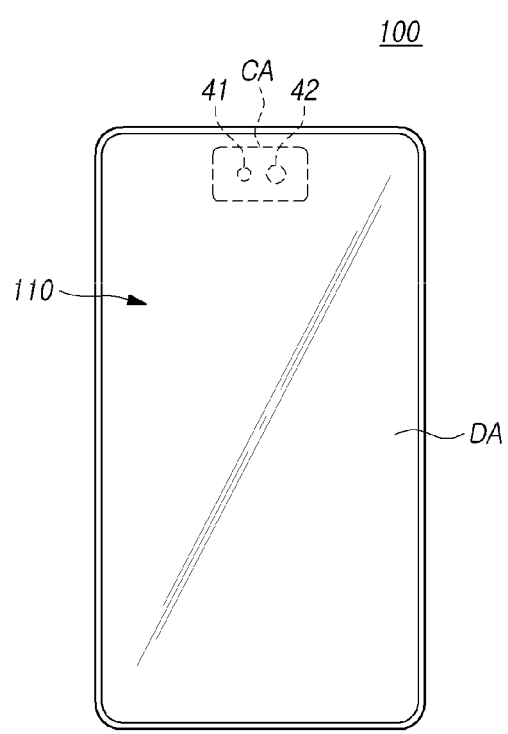
FIG. 1 is a schematic diagram of a display apparatus according to an embodiment of the present disclosure.

The advantages and features of the present disclosure and methods of achieving the same will be apparent by referring to embodiments of the present disclosure as described below in detail in conjunction with the accompanying drawings. However, the present disclosure is not limited to the embodiments set forth below, but may be implemented in various different forms. The following embodiments are provided only to completely disclose the present disclosure and inform those skilled in the art of the scope of the present disclosure.

In addition, the shapes, sizes, ratios, angles, numbers, and the like illustrated in the accompanying drawings for describing the embodiments of the present disclosure are merely examples, and the present disclosure is not limited thereto. Like reference numerals generally denote like elements throughout the present specification. Further, in the following description of the present disclosure, detailed description of well-known functions and configurations incorporated herein will be omitted when it is determined that the description may make the subject matter in some embodiments of the present disclosure rather unclear.

The terms such as "including," "having," "containing," and "comprising of" used herein are generally intended to allow other components to be added unless the terms are used with the term "only." Singular forms used herein are intended to include plural forms unless the context clearly indicates otherwise.

In interpreting any elements or features of the embodiments of the present disclosure, it should be considered to include a tolerance or error range even when a specific description is not conducted.

In the description related to spatial relationship, for example, when the positional relationship of two element is described using the terms of "on," "upper," "above," "below," "under," "beneath," "lower," "near," "close," "adjacent," it should be interpreted that one or more elements may be further "interposed" between the elements unless the terms such as "directly," "only" are used.

In the description related to time relationship, for example, time relative terms, such as "after," "subsequent to," "next to," "before," or the like, used herein to describe a temporal relationship between events, operations, or the like are generally intended to include events, situations, cases, operations, or the like that do not occur consecutively unless the terms, such as "directly," "immediately," or the like, are used.

When the terms, such as "first," "second," or the like, are used herein to describe various elements or components, it should be considered that these elements or components are not limited thereto. These terms are merely used herein for distinguishing an element from other elements. Therefore, a first element mentioned below may be a second element in a technical concept of the present disclosure.

It should be understood that the term "at least one" includes all possible combinations from one or more related items. For example, the meaning of "at least one of the first item, the second item, and the third item" may any combination of items that can be presented from more than two items of the first item, the second item and the third item, as well as the first item or the second item or the third item.

The elements or features of various embodiments of the present disclosure can be partially or entirely bonded to or combined with each other and can be interlocked and operated in technically various ways as can be fully understood by a person having ordinary skill in the art, and the various embodiments can be carried out independently of or in association with each other.

In the following description of examples or embodiments of the present invention, reference will be made to the accompanying drawings in which it is shown by way of illustration specific examples or embodiments that can be implemented, and in which the same reference numerals and signs can be used to designate the same or like components even when they are shown in different accompanying drawings from one another. Furthermore, the scales of the elements illustrated in the accompanying drawings are only for convenience of description, and are not limited to the scales shown in the drawings since they may have different scales from the actual cases.

Figure 2A:
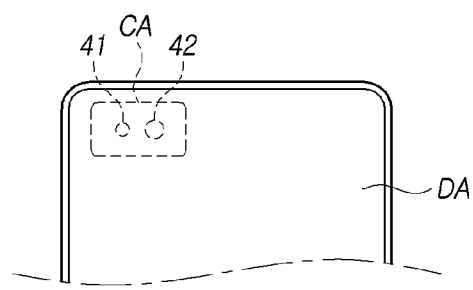
FIGS. 2A to 2D are diagrams illustrating various arrangements and shapes of an imaging area.
Figure 2B:
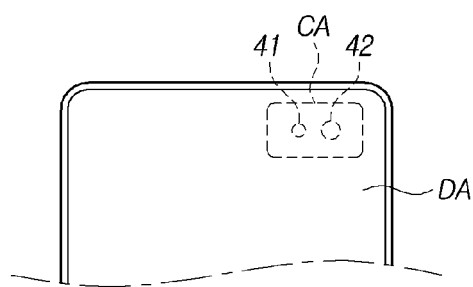
Figure 2C:
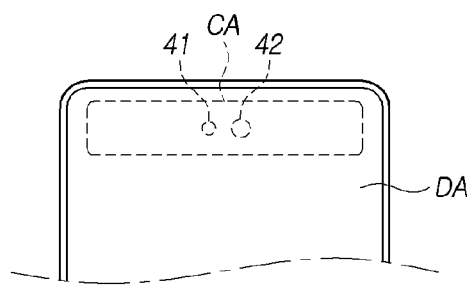
Figure 2D:
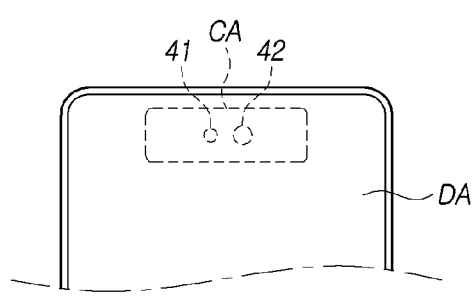
Figure 3:
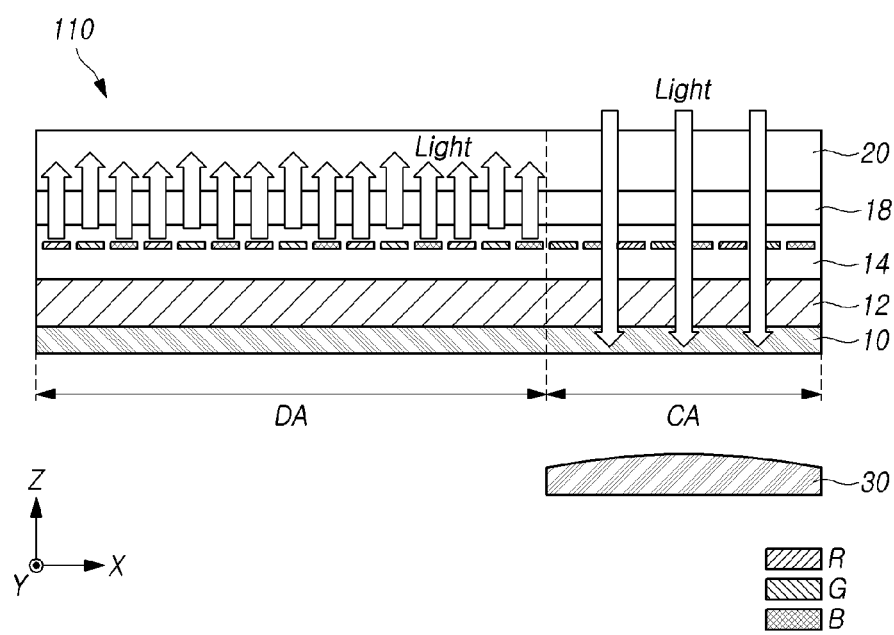
FIG. 3 is a schematic cross-sectional view of a display panel according to an embodiment of the present disclosure.
Figure 4:
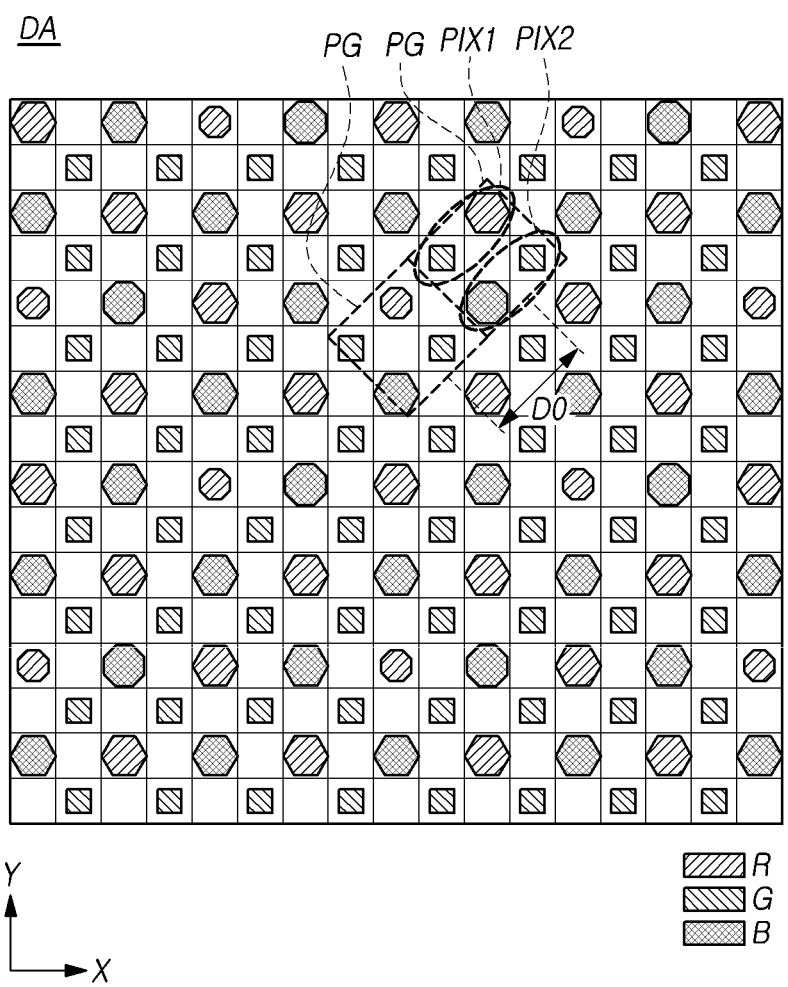
FIG. 4 is a diagram illustrating an arrangement of pixels arranged in a display area of a display panel according to an embodiment of the present disclosure.

FIG. 1 is a schematic diagram of a display apparatus 100 according to an embodiment of the present disclosure, FIGS. 2A to 2D are diagrams illustrating various arrangements and shapes of an imaging area, FIG. 3 is a schematic cross-sectional view of a display panel 110 according to an embodiment of the present disclosure, and FIG. 4 is a diagram illustrating an arrangement of pixels PIX arranged in a display area DA of a display panel 110 according to an embodiment of the present disclosure.

Referring to FIG. 1, a display panel 110 and a case may be included, and the front surface of the display panel 110 may be configured as a display area. Thus, a full-screen display may be possible.

The display area may include a first area DA and a second area CA. Both the first area DA and the second area CA display an image, but resolutions may be different. For example, the resolution of the plurality of second pixels disposed in the second area CA may be lower than the resolution of the plurality of first pixels disposed in the first area DA. As the resolution of the plurality of second pixels disposed in the second area CA decreases, a sufficient amount of light may be injected into sensors 41 and 42 disposed in the second area CA.

However, it is not necessarily limited thereto, and if the second area CA has sufficient light transmittance or an appropriate noise compensation algorithm can be implemented, the resolution of the first area DA and the resolution of the second area CA may be the same. It will be described the case as an example in which the resolution of the second area CA is lower than the resolution of the first area DA in the display panel 110 according to an embodiment of the present disclosure.

The second area CA included in the display panel 110 according to an embodiment of the present disclosure may be an area in which the sensors 41 and 42 are disposed. The second area CA is an area overlapping with various sensors and may have an area smaller than that of the first area DA for outputting most of the image.

The sensors 41 and 42 may include at least one of an image sensor, a proximity sensor, an illuminance sensor, a gesture sensor, a motion sensor, a fingerprint recognition sensor, and a biometric sensor. For example, the first sensor 41 may be an illuminance sensor, and the second sensor 42 may be an image sensor for capturing an image or a video, but is not limited thereto.

Referring to FIGS. 2A to 2D, the second area CA may be disposed at various locations where light incidence is required. For example, the second area CA may be disposed on the upper left of the display area displaying an image as shown in FIG. 2A, the second area CA may be disposed on the upper right side of the display area as shown in FIG. 2B, the second area CA may be entirely disposed on the top of the display area as shown in FIG. 2C, or the second area CA may be disposed on a part of the top of the display area as shown in FIG. 2D. However, it is not limited thereto, and the second area CA may be disposed at the center portion, lower portion, or side portion of the display area.

Hereinafter, the first area DA may be described as a display area and the second area CA may be described as an imaging area.

Referring to FIG. 3 and FIG. 4, the display area DA and the imaging area CA may include a pixel array in which pixels for emitting light according to pixel data are disposed. Each of the plurality of first pixels or the plurality of second pixels described above may mean a pixel array. In addition, resolution may mean the number of pixels per unit area (pixels per inch, PPI), and the number of pixels per unit area of the imaging area CA may be lower than the number of pixels per unit area of the display area DA in order to secure the light transmittance of the imaging area CA.

The pixel array of the display area DA may include a pixel area in which a plurality of pixels having a high number of pixels per unit area are disposed. A pixel area in which a plurality of first pixels having a high number of pixels per unit area are disposed in the display area DA may be referred to as a first pixel area.

In addition, the pixel array of the imaging area CA may include a pixel area in which a plurality of pixel groups having a relatively low number of pixels per unit area are disposed, which is separated by a light-transmitting area. A pixel area in which a plurality of second pixels having a low number of pixels per unit area are disposed in the imaging area CA may be referred to as a second pixel area. In the imaging area CA, external light may pass through the display panel 110 through a light-transmitting area having a high light transmittance and may be received by a sensor under the display panel 110.

Since both the display area DA and the imaging area CA include pixels, the input image can be displayed in both the display area DA and the imaging area CA.

Each of the pixels in the display area DA and the imaging area CA may include sub-pixels having different colors to implement a color of an image. The sub-pixels may include a red sub-pixel R, a green sub-pixel G, and a blue sub-pixel B. Each of the sub-pixels may further include a white sub-pixel, but in FIGS. 3 and 4, it will be described a case as an example including a red sub-pixel R, a green sub-pixel G, and a blue sub-pixel B. In addition, each of the sub-pixels may include a pixel circuit and a light emitting device.

The imaging area CA may include pixels and a sensor disposed under the screen of the display panel 110. As described above, the sensor may include various types of sensors, and it will be described a camera module as an example of the sensor disposed on the display apparatus 100 according to an embodiment of the present disclosure. The pixels arranged in the imaging area CA may display an image by the pixel data of an input image in the display mode.

The camera module may capture an external image in an imaging mode and output photo or video image data. The lens of the camera module may face the imaging area CA. The external light may be incident on the lens 30 of the camera module through the imaging area CA, and the lens 30 may collect the light to the image sensor. The camera module may capture an external image in the imaging mode and output photo or video image data.

Since, in the imaging area CA, the number of pixels per unit area of the pixel array is relatively low in order to secure light transmittance, an image quality compensation algorithm may be applied to compensate for the luminance and color coordinates of the pixels in the imaging area CA. Accordingly, a full screen display can be implemented without limiting the display area of the screen due to the camera module.

The display panel 110 has a width in the X-axis direction, a length in the Y-axis direction, and a thickness in the Z-axis direction. The display panel 110 may include a circuit layer 12 disposed on a substrate 10 and a light-emitting device layer 14 disposed on the circuit layer 12. An encapsulation layer 18 may be disposed on the light-emitting device layer 14, and a cover glass 20 may be disposed on the encapsulation layer 18. In some cases, in order to improve outdoor visibility of the display device 100, a polarizing plate may be disposed between the encapsulation layer 18 and the cover glass 20.

The circuit layer 12 may include a pixel circuit connected to lines such as data lines, gate lines, and power lines, and a gate driver connected to the gate lines. The circuit layer 12 may include circuit elements such as a transistor and a capacitor implemented as a thin film transistor (TFT), and lines. The lines and circuit elements of the circuit layer 12 may be implemented with a plurality of insulation layers, two or more metal layers separated from each other with an insulating layer therebetween, and an active layer including a semiconductor material.

The light-emitting device layer 14 may include a light-emitting device driven by the pixel circuit. For example, the light-emitting device may be implemented as an organic light emitting diode. The organic light emitting diode may include an organic compound layer formed between an anode and a cathode. The organic compound layer may include a hole injection layer (HIL), a hole transport layer (HTL), an emission layer (EML), an electron transport layer (ETL), and an electron injection layer (EIL), but is not limited thereto. Among the organic compound layers, layers other than the emission layer may be commonly stacked on pixels, and thus may be referred to as a common layer. If a voltage is applied to the anode and cathode of the organic light emitting diode, holes passing through the hole transport layer and electrons passing through the electron transport layer move to the emission layer to form excitons, and visible light may be emitted from the emission layer. The light-emitting device layer 14 is disposed on pixels that selectively transmit red, green, and blue wavelengths. In some cases, a color filter array may be disposed in a direction in which light passes from the light-emitting device layer 14.

The light-emitting device layer 14 may be covered by the encapsulation layer 18. The encapsulation layer 18 may have a structure in which an organic film and an inorganic film are alternately stacked. The inorganic film can block the penetration of moisture or oxygen, and the organic film can planarize the surface of the inorganic film. If the organic film and the inorganic film are stacked in multiple layers, the moving passage of moisture or oxygen is longer than that of a single layer, so that the penetration of moisture and oxygen affecting the light-emitting device layer 14 can be effectively blocked.

Referring to FIG. 4, the display area DA may include pixels PIX1 and PIX2 arranged in a matrix form. Each of the pixels PIX1 and PIX2 may be implemented as one unit pixel by including a plurality of sub-pixels among the red sub-pixel R, the green sub-pixel G, and the blue sub-pixel B.

Each of the pixels PIX1 and PIX2 may further include a white sub-pixel. In addition, two sub-pixels may be implemented as one pixel using a sub-pixel rendering algorithm. For example, the first pixel PIX1 may be implemented by including a red sub-pixel R and a green sub-pixel G, and the second pixel PIX2 may be implemented by including a blue sub-pixel B and a green sub-pixel G. The insufficient color representation in each of the pixels PIX1 and PIX2 may be compensated by an average value of corresponding color data of neighboring pixels through a sub-pixel rendering algorithm. In addition, when referring to the pixel group PG including the first pixel PIX1 and the second pixel PIX2, the display area DA includes pixel groups PG separated by a predetermined distance D0.

In the arrangement of the sub-pixels in FIG. 4, it is illustrated that the red sub-pixels R, the green sub-pixels G, the blue sub-pixels B, and the green sub-pixels G are arranged in zigzag in the X-axis direction, however, the arrangement of the sub-pixels is not limited thereto.

Figure 5A:
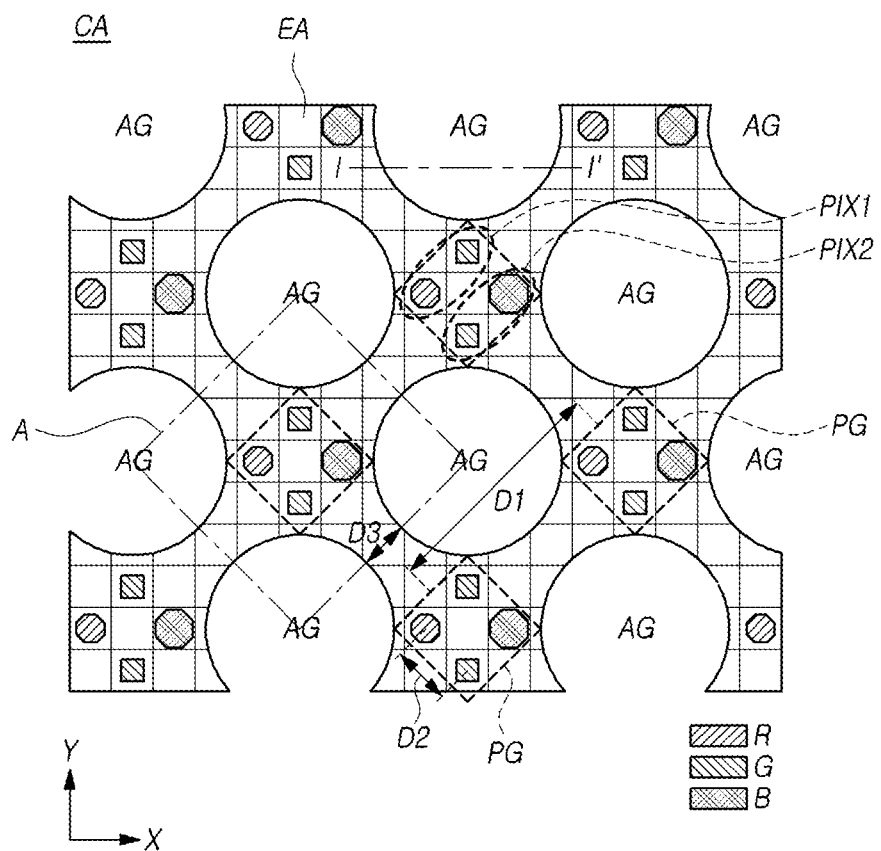
FIG. 5A is a diagram illustrating a pixel of an imaging area and a light-transmitting area according to an embodiment of the present disclosure.
Figure 5B:
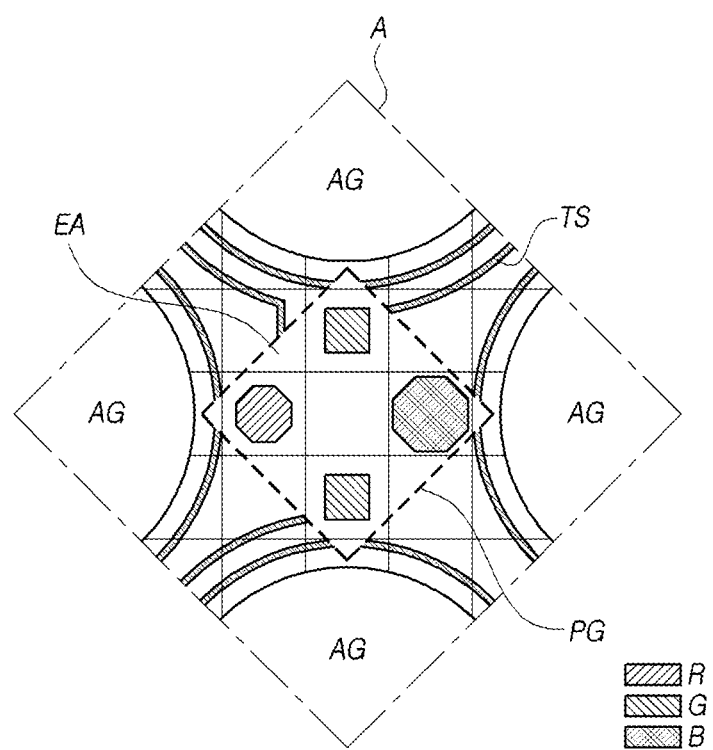
FIG. 5B is an enlarged view of portion A of FIG. 5A.

FIG. 5A is a diagram illustrating a pixel of an imaging area CA and a light-transmitting area AG in a display panel 110 according to an embodiment of the present disclosure, and FIG. 5B is an enlarged view of portion A of FIG. 5A.

Referring to FIG. 5A and FIG. 5B, a plurality of light-transmitting areas AG are disposed in the imaging area CA. The plurality of light-transmitting areas AG may be disposed between the plurality of second pixels. Specifically, the imaging area CA may include a pixel group PG spaced apart by a predetermined distance D1 and a light-transmitting area AG disposed between neighboring pixel groups PG. External light may be received by the lens of the camera module through the light-transmitting area AG. The pixel group PG includes the first pixel PIX1 and the second pixel PIX2, and may be spaced apart from each other in the second pixel area. In this case, the separation distance D1 of the pixel groups PG in the imaging area CA is greater than the separation distance D0 of the pixel groups PG in the display area DA. In FIG. 5A, the distance D1 between the pixel groups PGs in the imaging area CA is illustrated as twice the distance D0 between the pixel groups PGs in the display area DA, but is not limited thereto.

The light-transmitting area AG may include transparent media having high light transmittance without metal so that light can be incident with minimal light loss. The light-transmitting area AG may be formed of transparent insulating materials without including metal lines or pixels. The light transmittance of the imaging area CA may increase as the light-transmitting area AG increases.

The pixel group PG may include one or two pixels. Each of the pixels of the pixel group PG may include two to four sub-pixels. For example, one pixel in the pixel group PG may include a red sub-pixel R, a green sub-pixel G, and a blue sub-pixel B, or may include two sub-pixels among these sub-pixels, or may further include a white sub-pixel.

A distance D3 between the light-transmitting areas AG may be smaller than the distance D1 between the pixel groups PG. The distance D2 between the sub-pixels may be smaller than the distance D1 between the pixel groups PG.

The shape of the light-transmitting area AG is illustrated in a circular shape, but is not limited thereto. For example, the light-transmitting area AG may be designed in various shapes such as a circle, an ellipse, and a polygon.

Referring to FIG. 5B, all of the metal electrode material may be removed from the light-transmitting area AG. Accordingly, the lines TS of the pixel may be disposed outside the light-transmitting area AG. Accordingly, light may be effectively incident through the light-transmitting area AG. However, it is not necessarily limited thereto, and the metal electrode material may remain in a partial region of the light-transmitting area AG.

Figure 6:
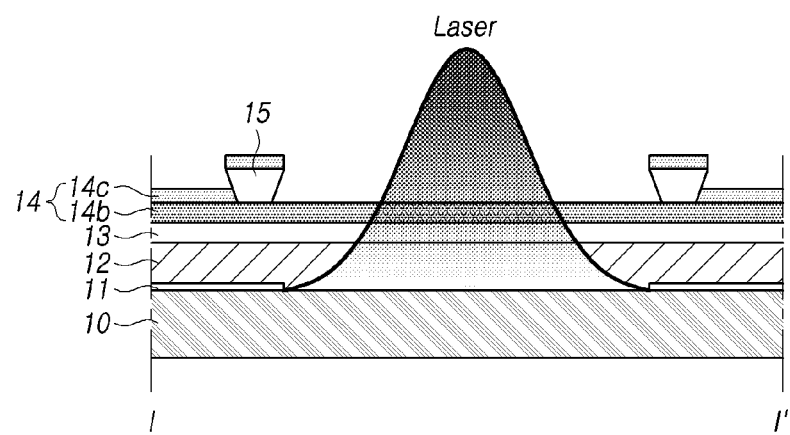
FIG. 6 is a diagram in which a first structure is formed on a bank to disconnect a cathode layer in a display apparatus according to an embodiment of the present disclosure.
Figure 7:
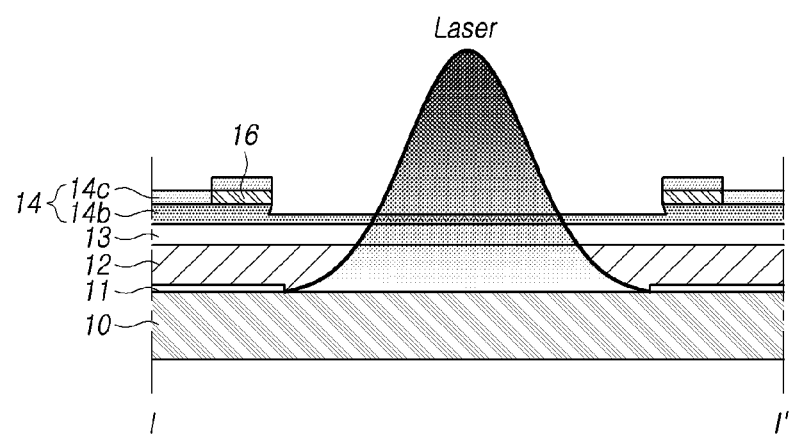
FIG. 7 is a diagram in which a second structure is formed on a bank to disconnect a cathode layer in a display apparatus according to another embodiment of the present disclosure.
Figure 8:
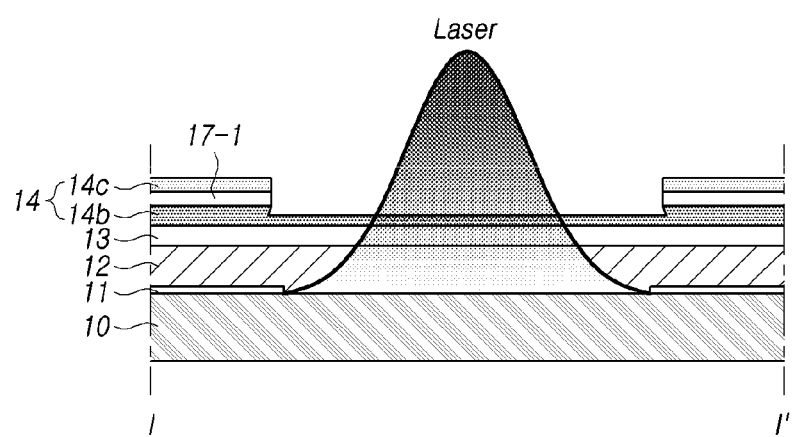
FIG. 8 is a diagram in which a third structure is formed on a bank to disconnect a cathode layer in a display apparatus according to another embodiment of the present disclosure.
Figure 9:
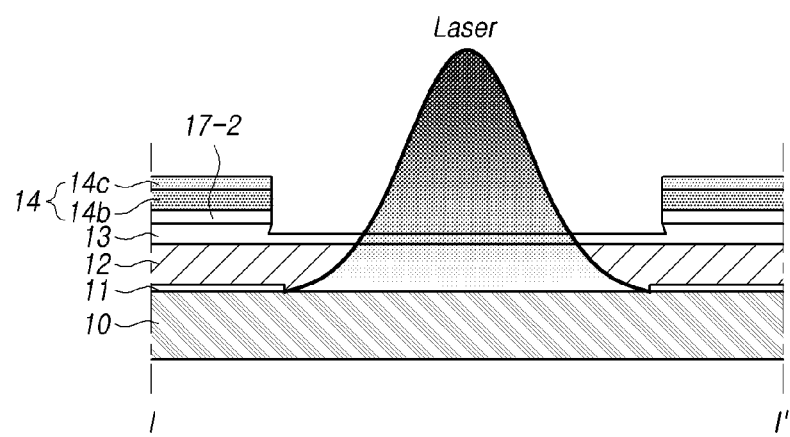
FIG. 9 is a diagram in which a fourth structure is formed on a planarization layer to disconnect a cathode layer in a display apparatus according to another embodiment of the present disclosure.
Figure 10:
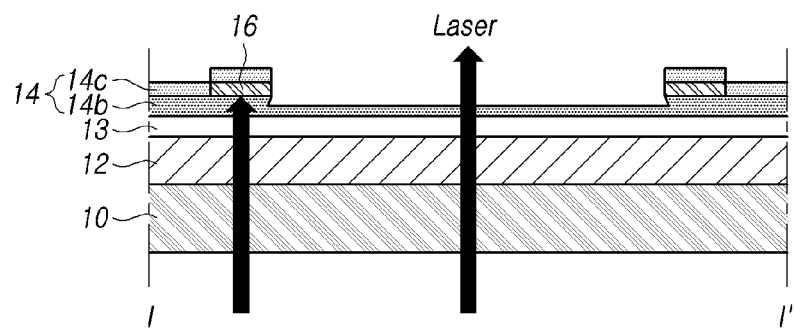
FIG. 10 is a diagram in which a light blocking layer is removed in a display apparatus according to another embodiment of the present disclosure.

FIG. 6 is a diagram in which a first structure is formed on a bank to disconnect a cathode layer in a display apparatus according to an embodiment of the present disclosure, FIG. 7 is a diagram in which a second structure is formed on a bank to disconnect a cathode layer in a display apparatus according to another embodiment of the present disclosure, FIG. 8 is a diagram in which a third structure is formed on a bank to disconnect a cathode layer in a display apparatus according to another embodiment of the present disclosure, FIG. 9 is a diagram in which a fourth structure is formed on a planarization layer to disconnect a cathode layer in a display apparatus according to another embodiment of the present disclosure, and FIG. 10 is a diagram in which a light blocking layer is removed in a display apparatus according to another embodiment of the present disclosure.

Referring to FIG. 6 to FIG. 10, in order to improve the transmittance of the imaging area CA, a cathode electrode of the light-transmitting area AG is patterned with a laser.

When patterning the cathode electrode using a light blocking layer 11, a difference may occur in the distribution of a laser beam reaching the cathode electrode.

The thermal energy of the laser beam reaching the outer portion of the light-transmitting area AG is relatively weaker than that of the laser beam reaching the center portion of the light-transmitting area AG. That is, when irradiating a laser beam, since only the degree of peeling occurs in the outer portion, unlike the center portion where the cathode electrode is evaporated, the thermal path may be curled up in the direction of the masked cathode electrode. That is, the edge curling phenomenon occurs in the cathode electrode at the outer portion of the light-transmitting area AG.

In this case, a moisture permeable path may be formed due to the edge curling of the cathode electrode at the end of the opening area, and when the energy level of the laser beam is increased to solve this problem, there may occur the damage even to the light-emitting area EA of the light-emitting device layer 14 due to heat conduction.

Therefore, before depositing the cathode electrode, by forming an inverse tapered under-cut structure using at least one of the first to fourth structures 15, 16, 17-1, 17-2, the cathode electrode may be formed in a physical disconnected structure, and may be patterned with a laser, thereby preventing the edge curling phenomenon of the cathode electrode at the outer portion of the light-transmitting area AG.

In addition, if the under-cut structure is applied, the moisture permeable path can also be blocked, so it is possible to improve reliability.

The under-cut structure may be formed by using the first structure 15, the second structure 16, the third and fourth structures 17-1, 17-2, etc. It will be described in more detail with reference to FIG. 6 to FIG. 10.

Referring to FIG. 6, a display apparatus according to an embodiment of the present disclosure may include a substrate 10, a light blocking layer 11, a circuit layer 12, a planarization layer 13, a light-emitting device layer 14, and a first structure 15.

The circuit layer 12 is disposed on the substrate 10, and the light blocking layer 11 is disposed between the substrate 10 and the circuit layer 12. The light blocking layer 11 may protect a thin film transistor and a light emitting device of the circuit layer 12 from irradiation of a laser beam.

The planarization layer 13 is formed on the circuit layer 12 to planarize the substrate surface. The planarization layer 13 may be formed of an organic insulating film such as photoacrylic, but is not limited thereto.

The light-emitting device layer 14 is disposed on the planarization layer 13. The light-emitting device layer 14 may include an anode layer (not shown), a light emission layer (not shown), a bank layer 14b, a cathode layer 14c, and the like. Each pixel area may be defined by the bank layer 14b. However, in the present specification, since a cross-sectional view of I-I' of FIG. 5A is illustrated for convenience of description, it is not illustrated a pixel area in which the anode layer and the emission layer are located.

The first structure 15 may be disposed on the bank layer 14b. The first structure 15 may be a spacer formed to have an inverse tapered shape. Accordingly, the bank layer 14b and the cathode layer 14c formed on the first structure 15 may have a structure in which they are disconnected from each other.

Accordingly, since a part of the cathode layer 14c is disconnected due to the first structure 15 with an inverse tapered shape, there may not occur the edge curling phenomenon of the cathode layer 14c even when irradiated with a laser beam.

That is, since the cathode layer 14c at the outer portion of the light-transmitting area AG has a physical disconnection with a portion of the cathode layer 14c on the upper portion of the first structure 15, even if a laser beam with a different distribution of thermal energy is irradiated at the center portion and the outer portion of the light-transmitting area AG, the cathode layer 14c in the outer portion of the light-transmitting area AG may be removed without causing the edge curling phenomenon.

Referring to FIG. 7, a display apparatus according to another embodiment of the present disclosure may include a substrate 10, a light blocking layer 11, a circuit layer 12, a planarization layer 13, a light-emitting device layer 14, and a second structure 16.

The second structure 16 may be disposed on the bank layer 14b. The second structure 16 may be a metal layer. It will omit the duplicate descriptions of the same stacked structure as in the embodiment of FIG. 6.

Before depositing the cathode layer 14c, the second structure 16 formed on the bank layer 14b of the light-transmitting area AG may be etched, and then the bank layer 14b of the light-transmitting area AG may be etched. In this case, the bank layer 14b may have a thickness of about 1 to 1.5 µm, and the thickness to be etched may be about 0.8 to 1.3 µm or less.

Since the second structure 16 is a metal layer, the second structure may be etched by a dry process, and the bank layer 14b may be etched by a wet process. Accordingly, when the bank layer 14b is etched, the bank layer 14b may be etched to have an inverse tapered shape under the second structure 16. Accordingly, the bank layer 14b and the cathode layer 14c formed on the second structure 16 may have a structure in which they are disconnected from each other.

That is, since the bank layer 14b is etched to have an inverse tapered shape by the second structure 16 and a part of the cathode layer 14c is disconnected, and thus the cathode layer 14c at the outer portion of the light-transmitting area AG has a physical disconnection with a portion of the cathode layer 14c on the upper portion of the second structure 16, even if a laser beam with a different distribution of thermal energy is irradiated at the center portion and the outer portion of the light-transmitting area AG, the cathode layer 14c in the outer portion of the light-transmitting area AG may be removed without causing the edge curling phenomenon.

In the case of the first structure 15 and the second structure 16, the structure may be mainly used for foldable products.

Referring to FIG. 8, a display apparatus according to another embodiment of the present disclosure may include a substrate 10, a light blocking layer 11, a circuit layer 12, a planarization layer 13, a light-emitting device layer 14, and a third structure 17-1.

The third structure 17-1 may be disposed on the bank layer 14b. The third structure 17-1 may be an inorganic layer. It will omit the duplicate descriptions of the same stacked structure as in the embodiment of FIG. 6.

Before depositing the cathode layer 14c, the third structure 17-1 formed on the bank layer 14b of the light-transmitting area AG may be etched, and then the bank layer 14b of the light-transmitting area AG may be etched. In this case, since the third structure 17-1 has a thickness of about 1000 to 6000 Å, all of the third structure 17-1 located in the light-transmitting area AG may be etched. Further, the bank layer 14b may have a thickness of about 1 to 1.5 and the thickness to be etched may be about 0.8 to 1.3 µm or less.

Since the third structure 17-1 is an inorganic layer, the bank layer 14b may be etched to have an inverse tapered shape under the third structure 17-1 by the wet etching process. Accordingly, the bank layer 14b and the cathode layer 14c formed on the third structure 17-1 may have a structure in which they are disconnected from each other.

That is, since the bank layer 14b is etched to have an inverse tapered shape by the third structure 17-1 and a part of the cathode layer 14c is disconnected, and thus the cathode layer 14c at the outer portion of the light-transmitting area AG has a physical disconnection with a portion of the cathode layer 14c on the upper portion of the third structure 17-1, even if a laser beam with a different distribution of thermal energy is irradiated at the center portion and the outer portion of the light-transmitting area AG, the cathode layer 14c in the outer portion of the light-transmitting area AG may be removed without causing the edge curling phenomenon.

Referring to FIG. 9, a display apparatus according to another embodiment of the present disclosure may include a substrate 10, a light blocking layer 11, a circuit layer 12, a planarization layer 13, a light-emitting device layer 14, and a fourth structure 17-2.

The fourth structure 17-2 may be disposed on the planarization layer 13. The fourth structure 17-2 may be an inorganic layer. It will omit the duplicate descriptions of the same stacked structure as in the embodiment of FIG. 6.

Before forming the bank layer 14b and the cathode layer 14c, the fourth structure 17-2 formed on the planarization layer 13 of the light-transmitting area AG may be etched, and then the planarization layer 13 of the light-transmitting area AG may be etched. In this case, since the fourth structure 17-2 has a thickness of about 1000 to 6000 Å, all of the fourth structure 17-2 located in the light-transmitting area AG may be etched.

In addition, the planarization layer 13 is generally formed to be thick to planarize the upper portion of the circuit layer 12, and may have a thickness larger than the thickness of the bank layer 14b or the fourth structure 17-2. Accordingly, only a part of the planarization layer 13 may be etched in the light-transmitting area AG.

Since the fourth structure 17-2 is an inorganic layer, the planarization layer 13 may be etched to have an inverse tapered shape under the fourth structure 17-2 by the wet etching process. Accordingly, the planarization layer 13, the fourth structure 17-2 and the cathode layer 14c formed on the bank layer 14b may have a structure in which they are disconnected from each other.

That is, since the planarization layer 13 is etched to have an inverse tapered shape by the fourth structure 17-2 and a part of the cathode layer 14c is disconnected, and thus the cathode layer 14c at the outer portion of the light-transmitting area AG has a physical disconnection with a portion of the cathode layer 14c on the upper portion of the fourth structure 17-2, even if a laser beam with a different distribution of thermal energy is irradiated at the center portion and the outer portion of the light-transmitting area AG, the cathode layer 14c in the outer portion of the light-transmitting area AG may be removed without causing the edge curling phenomenon.

In the case of the third structure 17-1 and the fourth structure 17-2, the structure may be mainly applicable to smartphone products.

Referring to FIG. 10, a display apparatus according to another embodiment of the present disclosure may include a substrate 10, a circuit layer 12, a planarization layer 13, a light-emitting device layer 14, and a second structure 16.

The circuit layer 12 is disposed on the substrate 10. Unlike the previous embodiments, the light blocking layer 11 may be omitted. In addition, it is illustrated only one example of the second structure 16 for convenience of explanation, but is not limited thereto, and all of the first to fourth structures 15, 16, 17-1, and 17-2 of the previous embodiment may be applicable. It will omit the duplicate descriptions of the same stacked structure as in the embodiment of FIG. 7.

In general, in a display device implemented in a large area, a laser beam may be irradiated in a wide range during a manufacturing process. Therefore, the light blocking layer 11 may be beneficial to protect the thin film transistor and the light-emitting device of the circuit layer 12.

However, in the products not having a large area, the laser beam may be irradiated to fit the light-transmitting area AG through a more precise manufacturing process. In this case, a laser beam may not be irradiated to a portion of the circuit layer 12 where the thin film transistor and the light-emitting device are located.

In addition, when forming the first to fourth structures 15, 16, 17-1, 17-2 on the planarization layer 13 or the bank layer 14b, the light blocking layer 11 may be removed during patterning of the cathode layer 14c by using a material having the absorption rate different from that of the cathode layer 14c. For example, the cathode layer 14c may be a material such as Ag or Mg, and the first to fourth structures 15, 16, 17-1, 17-2 may be a material such as Mo, a-Si, etc.

Therefore, before depositing the cathode electrode, by forming an inverse tapered under-cut structure using at least one of the first to fourth structures 15, 16, 17-1, 17-2, the cathode electrode 14c may be formed in a physical disconnected structure, and may be patterned with a laser, thereby preventing the edge curling phenomenon of the cathode electrode 14c at the outer portion of the light-transmitting area AG.

In the case that the cathode layer 14c is physically disconnected, it is possible to be patterned with low energy, and prevent the damage due to thermal energy of the laser beam in advance by preventing heat conduction to the light-emitting area EA of the light-emitting device layer 14.

Further, by applying the under-cut structure, it is possible to improve the reliability by blocking the moisture permeable path. In addition, depending on the absorption rate of the first to fourth structures 15, 16, 17-1, 17-2, the light blocking layer 11 may be removed or replaced.

It will be described a display apparatus according to an embodiment of the present disclosure as follows.

A display apparatus according to an embodiment of the present disclosure may include a first area in which a plurality of first pixels are disposed, and a second area including a light-emitting area in which a plurality of second pixels are disposed and a plurality of light-transmitting areas disposed between the plurality of second pixels. The light-transmitting area may be formed between structures disposed in the light-emitting area, and the structure may physically disconnect a cathode layer of the light-emitting area and a cathode layer of the light-transmitting area in the second area, and the cathode layer may be patterned in the light-transmitting area.

In the display apparatus according to an embodiment of the present disclosure, the structure may be formed in the form of an inverse tapered spacer.

In the display apparatus according to an embodiment of the present disclosure, the structure may be a metal layer at least partially surrounding the light-transmitting area.

In the display apparatus according to an embodiment of the present disclosure, an absorption rate of the metal layer may be different from an absorption rate of the cathode layer.

In the display apparatus according to an embodiment of the present disclosure, the metal layer may block a laser beam irradiated to the light-emitting area when the cathode layer in the light-transmitting area is patterned.

In the display apparatus according to an embodiment of the present disclosure, the structure may be formed of an inorganic film in the light-emitting area of the second area.

In the display apparatus according to an embodiment of the present disclosure, the structure may form an under-cut structure to block a heat conduction path to the light-emitting area.

In the display apparatus according to an embodiment of the present disclosure, the structure may form an under-cut structure to block a moisture permeable path.

A display apparatus according to an embodiment of the present disclosure may include a substrate including a light-emitting area and a light-transmitting area, a circuit layer formed on the substrate to include a thin film transistor, a planarization layer formed on the circuit layer to planarize a surface of the substrate, a light-emitting device layer formed on the planarization layer to include a bank layer, a cathode layer, and a structure, an encapsulation layer formed on the light-emitting device layer, and a cover glass formed on the encapsulation layer. The light-transmitting area may be formed between the structure disposed in the light-emitting area, and the structure may physically disconnect a cathode layer of the light-emitting area and a cathode layer of the light-transmitting area.

In the display apparatus according to an embodiment of the present disclosure, the structure may be formed on the bank layer, the cathode layer may be formed on the bank layer and the structure, and the cathode layer formed on the light-transmitting area may be patterned.

In the display apparatus according to an embodiment of the present disclosure, a thickness of the inorganic film may be smaller than a thickness of the bank layer.

The features, structures, effects, and the like described in the examples of the present specification described above are included in at least one example of the present specification, and are not necessarily limited to only one example. Furthermore, the features, structures, effects, and the like exemplified in at least one example of the present specification may be combined or modified for other examples by those of ordinary skill in the art of the present specification. Accordingly, contents related to such combinations and modifications should be construed as being included in the scope of the present specification.

The present specification described above is not limited to the above-described embodiments and the accompanying drawings, and various substitutions, modifications, and changes will be readily apparent to those skilled in the art of the present specification without departing from the technical matters of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display apparatus comprising:
a first area in which a plurality of first pixels is disposed; and
a second area including a light-emitting area in which a plurality of second pixels areis disposed, and a plurality of light-transmitting areas disposed between the plurality of second pixels,
wherein at least one light-transmitting area among the plurality of light-transmitting areas is formed between adjacent structures, or surrounded by a corresponding structure, among a plurality of structures disposed in the light-emitting area, and a cathode layer of the light-emitting area is physically disconnected from the at least one light-transmitting area by the adjacent structures or the corresponding structure,
wherein the cathode layer is not present in the light-transmitting area.

2. The display apparatus of claim 1, wherein the at least one structure is formed in the form of an inverse tapered spacer.

3. The display apparatus of claim 1, wherein the at least one structure is a metal layer at least partially surrounding the light-transmitting area.

4. The display apparatus of claim 3, wherein an absorption rate of the metal layer is different from an absorption rate of the cathode layer.

5. The display apparatus of claim 4, wherein the metal layer, in operation, blocks a laser beam irradiated to the light-emitting area.

6. The display apparatus of claim 1, wherein the at least one structure is formed of an inorganic film in the light-emitting area of the second area.

7. The display apparatus of claim 6, wherein a thickness of the inorganic film is formed to be about 1 um or less.

8. The display apparatus of claim 1, wherein the at least one structure forms an under-cut structure to block a heat conduction path to the light-emitting area.

9. The display apparatus of claim 1, wherein the at least one structure forms an under-cut structure to block a moisture permeable path.

10. A display apparatus comprising:
a substrate including a light-emitting area and a light-transmitting area;
a circuit layer on the substrate including a thin film transistor;
a planarization layer on the circuit layer planarizing a surface of the circuit layer;
a light-emitting device layer on the planarization layer including:
a bank layer,
a cathode layer, and
a structure physically disconnecting the cathode layer of the light-emitting area and the cathode layer of the light-transmitting area;
an encapsulation layer on the light-emitting device layer; and
a cover glass on the encapsulation layer,
wherein the light-transmitting area is formed between the structure disposed in the light-emitting area.

11. The display apparatus of claim 10, wherein the structure is formed on the bank layer, the cathode layer is formed on the bank layer and the structure.

12. The display apparatus of claim 11, wherein the structure is formed in the form of an inverse tapered spacer.

13. The display apparatus of claim 11, wherein the structure is a metal layer at least partially surrounding the light-transmitting area.

14. The display apparatus of claim 13, wherein an absorption rate of the metal layer is different from an absorption rate of the cathode layer.

15. The display apparatus of claim 14, wherein the metal layer, in operation, blocks a laser beam irradiated to the light-emitting area.

16. The display apparatus of claim 11, wherein the structure is formed of an inorganic film in the light-emitting area.

17. The display apparatus of claim 16, wherein a thickness of the inorganic film is smaller than a thickness of the bank layer.

18. The display apparatus of claim 10, wherein the structure is formed on the planarization layer, the bank layer is formed on the structure, and the cathode layer is formed on the bank layer.

19. The display apparatus of claim 10, wherein the structure forms an under-cut structure to block a heat conduction path to the light-emitting area.

20. The display apparatus of claim 10, wherein the structure forms an under-cut structure to block a moisture permeable path.

21. The display apparatus of claim 10, further comprising a light blocking layer disposed between the substrate and the circuit layer.

22. A display apparatus comprising:
- a substrate including a light-emitting area and aat least one light-transmitting area;
- a circuit layer on the substrate;
- a planarization layer on the circuit layer planarizing a surface of the substrate; and
- a light-emitting device layer on the planarization layer including:
  - a bank layer,
  - a cathode layer, and
  - at least one structure,
- wherein one of the at least one structure, the planarization layer, and the bank layer has an inverse tapered shape, and the cathode layer of the light-emitting area is physically disconnected from the at least one light-transmitting area by the at least one structure, and
- wherein the cathode layer is not disposed in the at least one light-transmitting area.

* * * * *

UNITED STATES PATENT AND TRADEMARK OFFICE
CERTIFICATE OF CORRECTION

| | | |
|---|---|---|
| PATENT NO. | : 12,232,353 B2 | Page 1 of 1 |
| APPLICATION NO. | : 17/384395 | |
| DATED | : February 18, 2025 | |
| INVENTOR(S) | : Byeong-Seong So | |

It is certified that error appears in the above-identified patent and that said Letters Patent is hereby corrected as shown below:

In the Claims

Column 14, Claim 1, Line 6:
"pixels areis disposed,"
Should read:
-- pixels is disposed, --.

Column 14, Claim 7, Line 34:
"about 1 um or less."
Should read:
-- about 1 μm or less. --.

Column 16, Claim 22, Line 5:
"and aat least"
Should read:
-- and at least --.

Signed and Sealed this
Twenty-second Day of April, 2025

Coke Morgan Stewart
*Acting Director of the United States Patent and Trademark Office*